United States Patent
Kawagoe et al.

(10) Patent No.: US 9,596,747 B2
(45) Date of Patent: Mar. 14, 2017

(54) WIRING SUBSTRATE AND ELECTRONIC DEVICE

(75) Inventors: Hiroshi Kawagoe, Kyoto (JP); Kazuhiko Yagi, Kyoto (JP)

(73) Assignee: KYOCERA CORPORATION (JP)

(*) Notice: Subject to any disclaimer, the term of this patent is extended or adjusted under 35 U.S.C. 154(b) by 182 days.

(21) Appl. No.: 14/233,984

(22) PCT Filed: Jun. 29, 2012

(86) PCT No.: PCT/JP2012/066752
§ 371 (c)(1),
(2), (4) Date: Feb. 19, 2014

(87) PCT Pub. No.: WO2013/015073
PCT Pub. Date: Jan. 31, 2013

(65) Prior Publication Data
US 2014/0196934 A1    Jul. 17, 2014

(30) Foreign Application Priority Data
Jul. 22, 2011  (JP) .................. 2011-161070

(51) Int. Cl.
*H05K 1/02* (2006.01)
*H01L 23/367* (2006.01)
(Continued)

(52) U.S. Cl.
CPC ....... *H05K 1/0209* (2013.01); *H01L 23/3677* (2013.01); *H01L 23/498* (2013.01);
(Continued)

(58) Field of Classification Search
USPC ......................................................... 257/98
See application file for complete search history.

(56) References Cited

U.S. PATENT DOCUMENTS 3,721,550 A * 3/1973 Schreiner .................. B22F 3/26
419/27
4,831,212 A * 5/1989 Ogata et al. ................... 174/546
(Continued)

FOREIGN PATENT DOCUMENTS

JP    2001185383 A    7/2001
JP    2006066409 A    3/2006
(Continued)

OTHER PUBLICATIONS

International Search Report, PCT/US2012/066752, Aug. 20, 2012, 1 pp.

*Primary Examiner* — Michael F McAllister
(74) *Attorney, Agent, or Firm* — Volpe and Koenig, PC.

(57) ABSTRACT

A wiring substrate in which a plating layer is sufficiently plated on a surface metal layer and which has an excellent reliability is provided. A wiring substrate includes an insulating base; a heat dissipation member disposed in the insulating base, the heat dissipation member partially exposed from the insulating base, the heat dissipation member containing Cu; a surface metal layer disposed on a surface of the insulating base, the surface metal layer contacting and covering the heat dissipation member, the surface metal layer containing Mo as a main component, the surface metal layer including a surface portion containing Cu; and a plating layer disposed on the surface metal layer, wherein Cu contained in the heat dissipation member and Cu contained in the surface portion are bonded to each other.

3 Claims, 7 Drawing Sheets

(51) Int. Cl.
    *H01L 23/498* (2006.01)
    *H05K 7/20* (2006.01)
    *H01L 23/495* (2006.01)
    *H01L 23/31* (2006.01)
    *H01L 33/64* (2010.01)
    *H05K 3/24* (2006.01)
    *H01L 23/00* (2006.01)

(52) U.S. Cl.
    CPC .... H01L 23/49844 (2013.01); *H01L 23/3107* (2013.01); *H01L 24/73* (2013.01); *H01L 33/641* (2013.01); *H01L 2224/32225* (2013.01); *H01L 2224/45144* (2013.01); *H01L 2224/48227* (2013.01); *H01L 2224/48644* (2013.01); *H01L 2224/48655* (2013.01); *H01L 2224/73265* (2013.01); *H01L 2224/85444* (2013.01); *H01L 2224/85455* (2013.01); *H01L 2924/01013* (2013.01); *H01L 2924/01014* (2013.01); *H01L 2924/01028* (2013.01); *H05K 1/0204* (2013.01); *H05K 3/246* (2013.01); *H05K 2201/10416* (2013.01)

(56) References Cited

U.S. PATENT DOCUMENTS

| | | | | |
|---|---|---|---|---|
| 4,943,470 A | * | 7/1990 | Shiromizu et al. | 428/209 |
| 5,039,335 A | * | 8/1991 | Gondusky et al. | 75/246 |
| 5,167,697 A | * | 12/1992 | Koumura | C22C 1/045 |
| | | | | 257/E23.006 |
| 5,285,352 A | * | 2/1994 | Pastore et al. | 361/707 |
| 5,686,676 A | * | 11/1997 | Jech | B22F 3/001 |
| | | | | 419/38 |
| 5,731,067 A | * | 3/1998 | Asai | H01L 23/3677 |
| | | | | 174/252 |
| 6,914,032 B2 | * | 7/2005 | Kim | B22F 3/001 |
| | | | | 419/31 |
| 6,914,321 B2 | * | 7/2005 | Shinohara | H01L 23/4334 |
| | | | | 257/502 |
| 7,122,069 B2 | * | 10/2006 | Dorfman | B22F 1/025 |
| | | | | 428/570 |
| 7,521,863 B2 | * | 4/2009 | Tanda | 313/512 |
| 7,923,826 B2 | * | 4/2011 | Takahashi et al. | 257/675 |
| 8,314,346 B2 | * | 11/2012 | Hasegawa et al. | 174/260 |
| 2002/0060356 A1 | * | 5/2002 | Nishibori et al. | 257/668 |
| 2004/0102023 A1 | * | 5/2004 | Morozumi | H01L 23/3735 |
| | | | | 438/460 |
| 2007/0057364 A1 | * | 3/2007 | Wang | C03C 8/02 |
| | | | | 257/701 |
| 2008/0043444 A1 | * | 2/2008 | Hasegawa | H01L 33/642 |
| | | | | 361/717 |
| 2011/0169037 A1 | | 7/2011 | Hasegawa et al. | |
| 2011/0220939 A1 | * | 9/2011 | Nakayama | H01L 33/44 |
| | | | | 257/98 |

FOREIGN PATENT DOCUMENTS

| | | |
|---|---|---|
| JP | 2009071013 A | 4/2009 |
| JP | 2010034238 A | 2/2010 |

* cited by examiner

WIRING SUBSTRATE AND ELECTRONIC DEVICE

FIELD OF INVENTION

The present invention relates to a wiring substrate for mounting an electronic component such as a semiconductor element or a light emitting element, and an electronic device.

BACKGROUND

In the related art, an insulating base made of ceramics such as an aluminum oxide-based sintered compact (alumina ceramics), for example, is used as a wiring substrate on which an electronic component is mounted and that is assembled in an electronic device. In the wiring substrate, a heat dissipation member may be embedded in the insulating base to improve a heat dissipation characteristic (for example, see Patent Literature 1). In such a wiring substrate, a surface metal layer may be disposed on the surface of the heat dissipation member and the insulating base.

As the heat dissipation member, for example, copper-tungsten (CuW) is used as a material that can be co-fired with the above-described alumina ceramics and has a thermal expansion coefficient close to that of the alumina ceramics. CuW is also used in the surface metal layer and a wiring conductor for co-firing with the alumina ceramics. However, when CuW is used as a material of the heat dissipation member and the surface metal layer, Cu of the surface metal layer moves to the heat dissipation member when firing, which causes a problem that the surface metal layer is not sintered.

CITATION LIST

Patent Literature

Patent Literature 1: Japanese Unexamined Patent Publication JP-A 2006-066409

SUMMARY

Technical Problem

As the material of the surface metal layer, for example, molybdenum (Mo) having a sintering temperature lower than that of W, which is a high-melting point metallic material capable of being co-fired with the heat dissipation member, may be used.

However, in the case where Mo is used as the high-melting point metallic material of the surface metal layer, when a plating layer is to be plated on an exposed surface of the surface metal layer, the plating layer is not easily plated on the surface of the surface metal layer, and the plating layer may be peeled off from the surface metal layer.

Solution to Problem

According to an aspect of the invention, a wiring substrate includes an insulating base; a heat dissipation member disposed in the insulating base, the heat dissipation member partially exposed from the insulating base, the heat dissipation member containing Cu; a surface metal layer disposed on a surface of the insulating base, the surface metal layer contacting and covering the heat dissipation member, the surface metal layer containing Mo as a main component, the surface metal layer comprising a surface portion containing Cu; and a plating layer disposed on the surface metal layer. Cu contained in the heat dissipation member and Cu contained in the surface portion are bonded to each other.

According to another aspect of the invention, an electronic device includes the wiring substrate having the above constitution; and an electronic component mounted on the wiring substrate.

Advantageous Effects of Invention

According to the wiring substrate of the invention, the plating layer is plated using Cu contained in the surface portion of the surface metal layer as a start point. Further, since Cu contained in the heat dissipation member and Cu contained in the surface portion are bonded to each other, it is possible to suppress Cu bonded to the plating layer from being peeled off from the surface portion together with the plating layer. Accordingly, it is possible to suppress the plating layer from being peeled off from the surface metal layer.

Further, according to the electronic device of the invention, since the wiring substrate 1 having the above constitution and the electronic component 2 mounted on the wiring substrate 1 are provided, it is possible to increase thermal conductivity to an external circuit board from the electronic device, and to improve a heat dissipation characteristic of the electronic device.

DETAILED DESCRIPTION OF THE PREFERRED EMBODIMENTS

Exemplary embodiments of the invention will be described with reference to the accompanying drawings.

(First Embodiment)

Figure 3:
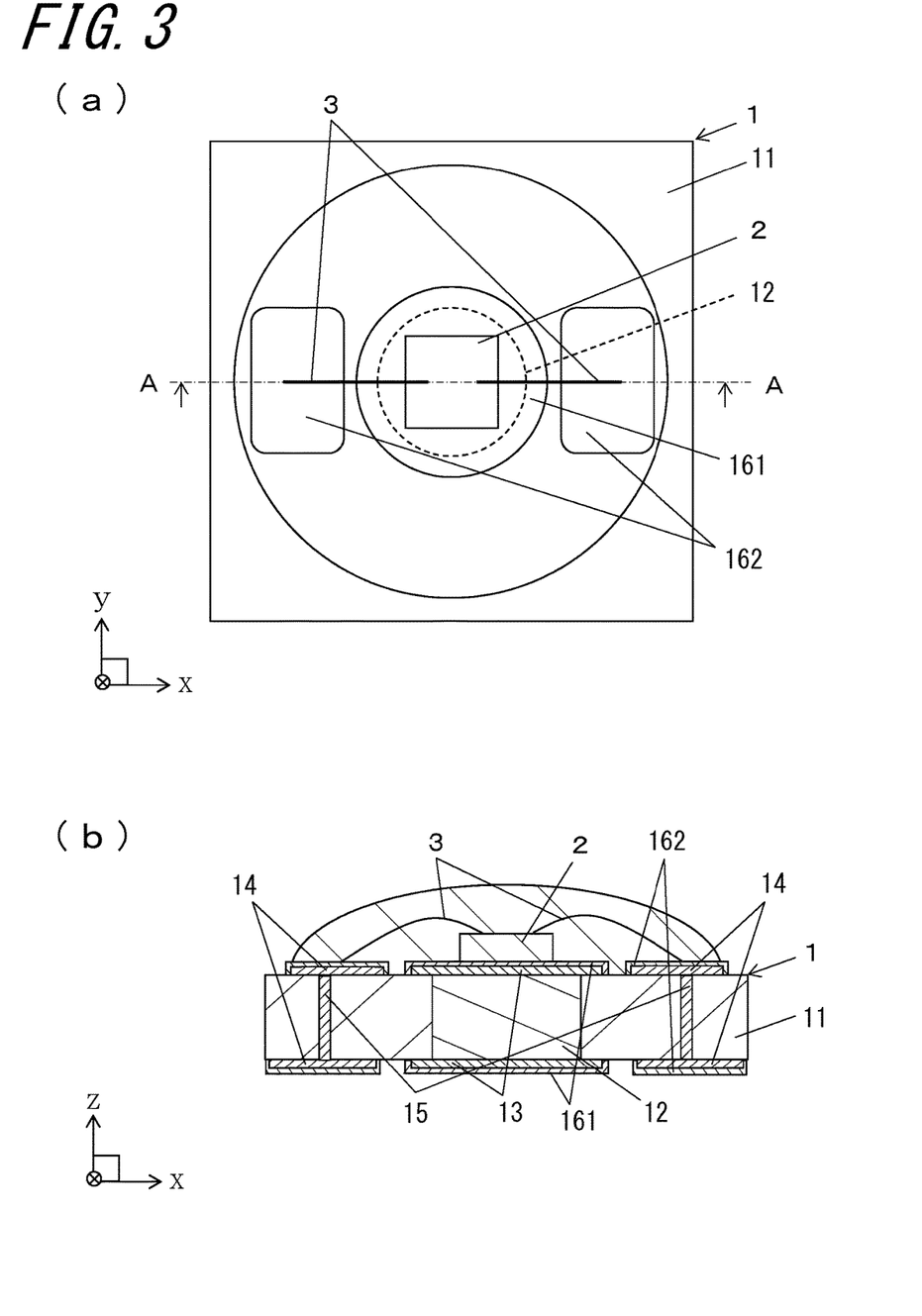
FIG. 3(a) is a top view illustrating another example of the electronic device according to the first embodiment of the invention.
FIG. 3(b) is a cross-sectional view taken along the line A-A in FIG. 3(a)
Figure 4:
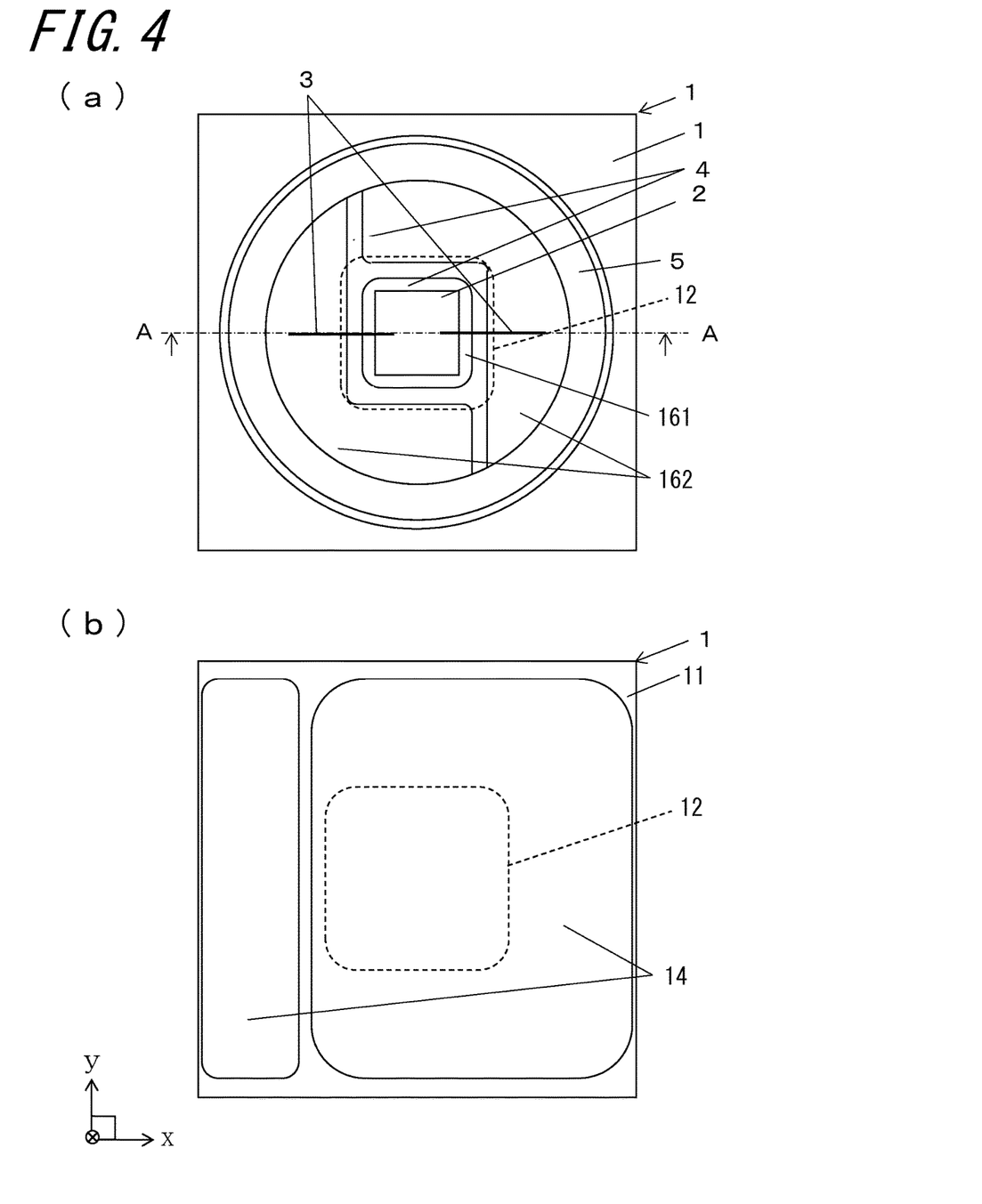
FIG. 4(a) is a top view illustrating another example of the electronic device according to the first embodiment of the invention.
FIG. 4(b) is a bottom view of the electronic device shown in FIG. 4(a)
Figure 5:
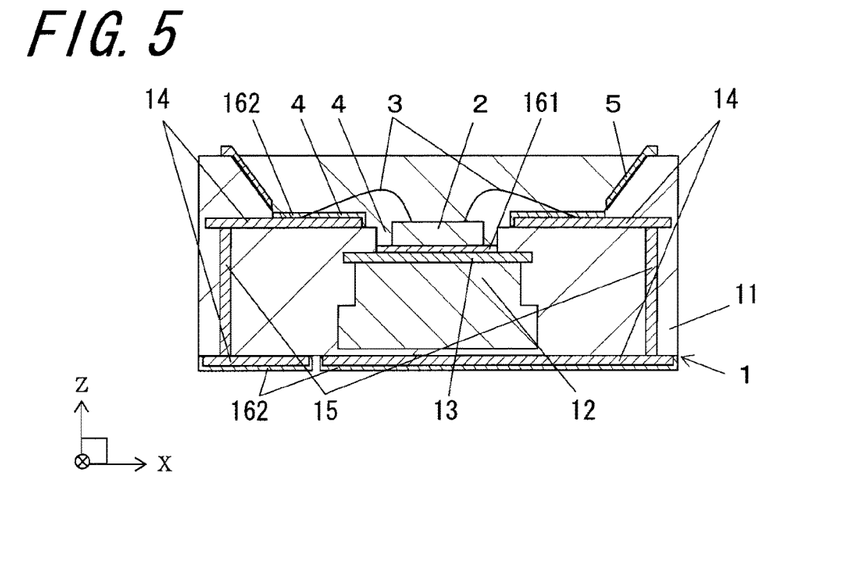
FIG. 5 is a cross-sectional view of the electronic device shown in FIG. 4(a) taken along the line A-A.

An electronic device according to a first embodiment of the invention includes a wiring substrate 1, and an electronic component 2 disposed on an upper surface of the wiring substrate 1, as shown in FIGS. 1 to 5. The electronic device is mounted on an external circuit board constituting an electronic component module, for example. In FIGS. 1 to 5, the electronic device is mounted on an xy plane in an imaginary xyz space. In FIG. 2(a), FIG. 3(b) and FIG. 5, an upper direction represents a positive direction of an imaginary z-axis.

As in examples shown in FIGS. 1 to 5, the wiring substrate 1 in the present embodiment includes an insulating base 11, a heat dissipation member 12 disposed in the insulating base 11 to be partially exposed from the insulating base 11, a surface metal layer 13 disposed on a surface of the insulating base 11 so as to contact the heat dissipation member 12 and cover the heat dissipation member 12, a wiring conductor 15 disposed on the surface of the insulating base 11 and inside the insulating base 11, and a plating layer 16 disposed on the surface metal layer 13.

The wiring substrate 1 of the examples shown in FIGS. 1 to 5 further includes a second surface metal layer 14 that is disposed in a vicinity of the surface metal layer 13 on the surface of the insulating base 11 or on a lower surface of the insulating base 11 and does not contact the heat dissipation member 12.

The insulating base 11 has the upper surface including a mounting region of the electronic component 2, and has a rectangular plate shape in a plan view. The insulating base 11 functions as a support for supporting the electronic component 2, and the electronic component 2 is adhesively fixed onto the mounting region in a central part of the upper surface through an adhesive such as a low melting point brazing material or a conductive resin.

The insulating base 11 is formed of ceramics such as an aluminum oxide-based sintered compact (alumina ceramics), an aluminum nitride sintered compact or a mullite sintered compact.

For example, in the case of the aluminum oxide-based sintered compact, the insulating base 11 is manufactured by admixing raw material powder formed of aluminum oxide, silicon oxide, magnesium oxide, calcium oxide and so on with an appropriate organic binder, an organic solvent and the like into slurry, shaping the slurry into a sheet by a known doctor blade method, a calendar roll method or the like to obtain a ceramic green sheet, and then, performing an appropriate punching work for the ceramic green sheet, laminating the plural ceramic green sheets, and firing the laminate at a high temperature (about 1300° C. to 1400° C.).

The heat dissipation member 12 transfers heat generated from the electronic component 2 mounted on the wiring substrate 1 to the outside of the wiring substrate 1 to enhance the heat dissipation characteristic of the wiring substrate 1, and is embedded in the insulating base 11 to be partially exposed from the insulating base 11 on the upper surface and the lower surface of the insulating base 11.

Further, the heat dissipation member 12 has a rectangular shape having rounded corners or a circular column shape in a plan view, for example. The heat dissipation member 12 has a shape larger in size than the electronic component 2 in a plan view.

The heat dissipation member 12 contains Cu and a high-melting point metallic material having a melting point higher than that of Cu, as a main component, and for example, contains CuW. In this description, the "main component" refers to a component that constitutes the largest content in the components. The main component is preferably included by 50% or greater by mass with respect to the entirety of the components. In the components constituting the heat dissipation member 12, the content of CuW is the largest. Further, in the components constituting the heat dissipation member 12, the content of CuW may be contained by 50% or greater by mass.

In the manufacturing process of the heat dissipation member 12, after a hole is formed in the ceramic green sheet for the insulating base 11 by a punching work using a die or a punch or by a laser work, a metal sheet or a metal paste is provided in the hole. The metal sheet or the metal paste will form the heat dissipation member 12.

When the heat dissipation member 12 is exposed from the upper surface of the insulating base 11 as in the examples shown in FIGS. 1 to 5, it is effective in enhancing the heat dissipation characteristic of the electronic component 2, compared with a case where the heat dissipation member 12 is not exposed. The heat dissipation member 12 may be exposed from the upper and lower surfaces of the insulating base 11 as in the examples shown in FIGS. 1 to 3, and may be exposed from only the upper surface of the insulating base 11 as in the example shown in FIGS. 4 and 5.

When the heat dissipation member 12 is manufactured using the metal sheet, the metal sheet may be formed to have the same shape as the hole of the ceramic green sheet for the insulating base 11 in a plan view and the same thickness as the depth of the hole of the ceramic green sheet, and may be embedded to fill the hole of the ceramic green sheet. When the hole is formed by the punching work in the ceramic green sheet and the metal sheet is embedded therein at the same time, it is possible to efficiently manufacture a compact.

For example, by mounting the metal sheet on the upper surface of the ceramic green sheet for the insulating base 11 formed with the through hole, and punching a through hole in the metal sheet and the ceramic green sheet from a metal sheet side using a punching die that will form the through hole in the ceramic green sheet, it is possible to insert the metal sheet punched at the same size as that of the through hole, in the through hole of the ceramic green sheet.

The metal sheet is manufactured by adding an organic binder and an organic solvent to metal powder using a predetermined amount of plasticizer or dispersant as necessary to obtain slurry, coating the slurry on a support made of resin such as polyethylene terephthalate (PET) or made of paper by a forming method such as a doctor blade method, a lip coater method or a die coater method to shape a sheet, and drying the shaped sheet by a drying method such as warm-air drying, vacuum drying or far infrared drying.

As the metal powder, tungsten (W) powder or copper (Cu) powder may be used. The metal powder may have any form of mixture and alloy. If the metal sheet in which the Cu powder and the W powder are mixed is used, it is possible to manufacture the heat dissipation member 12 made of copper tungsten (CuW) with an excellent heat dissipation characteristic.

As the organic binder used in the metal sheet and the organic solvent included in the slurry, the same material as the material used in the ceramic green sheet may be used.

The additive amount of the organic binder may be set so that the organic binder is easily decomposed to be removed when firing, the metal power is dispersed, and handling performance of the green sheet and workability thereof are excellent, and is preferably about 10% by mass to about 20% by mass with respect to the metal powder.

It is preferable that the amount of the organic solvent is set to have a viscosity capable of preferably coating the slurry on the support by adding the amount of 30% by mass to 100% by mass with respect to the metal powder, and specifically, about 3 cps to about 100 cps.

The metal paste for the heat dissipation member 12 is manufactured by adding an organic binder and an organic solvent, and as necessary, a dispersant or the like to metal powder of W and Cu that is a main component, and performing mixing and kneading by kneading means such as a ball mill, a triple roll mill or a planetary mixer.

The additive amount of the organic binder used in the metal paste for the heat dissipation member 12 may be set so that the organic binder is easily decomposed and removed when firing, and the metal powder can be dispersed, and is preferably the amount of about 5% by mass to 20% by mass with respect to the metal powder. The organic solvent is added by the amount of 4% by mass to 15% by mass with respect to the metal powder, and is adjusted to about 15000 cps to about 40000 cps.

In order to match a firing shrinkage behavior or shrinkage percentage of the ceramic green sheet when firing, or in order to secure a bonding strength of the heat dissipation member 12 after firing, glass powder or ceramic power may be added to the metal paste.

Further, when the metal paste is used as the metallic material of the heat dissipation member 12, the metal paste may be adjusted to have a viscosity such that the metal paste is retained in the hole of the ceramic green sheet. It is preferable that the hole of the ceramic green sheet has a bottom.

Further, as in the example shown in FIG. 4, the heat dissipation member 12 may have different sizes on an upper surface side and a lower surface side of the wiring substrate 1 in a plan view, and may form a step between on the upper surface side and the lower surface side. This configuration is effective for securing a region for provision of the wiring conductor 15 on the upper surface side of the insulating base 11.

The heat dissipation member 12 having such a shape may be manufactured by forming a laminated body in which plural ceramic green sheets are laminated, forming a first through hole on the upper ceramic green sheet, forming a second through hole larger in diameter than the first through hole on the lower ceramic green sheet, embedding a metal sheet or a metal paste that will form the heat dissipation member 12 having a size fit for the respective through holes, and laminating and pressurizing the upper and lower ceramic green sheets.

The surface metal layer 13 has a surface portion that contains molybdenum (Mo) as a main component and contains Cu. The surface portion has a structure in which Cu is exposed to be dotted on a surface containing Mo as the main component in a plan view.

A part of Cu contained in the surface metal layer 13 is bonded with Cu contained in the heat dissipation member as in the example shown in FIG. 2(b). Further, a part of Cu exposed to be dotted on the surface containing Mo as the main component is bonded with Cu contained in the heat dissipation member 12. That is, Cu contained in the heat dissipation member 12 and Cu contained in the surface portion of the surface metal layer 13 are bonded to each other.

The surface metal layer 13 is formed by metalizing metal powder of Mo or metal powder of Mo and Cu, and the second surface metal layer 14 is formed by metalizing metal powder of W and Cu. The metal powder may have any form of mixture and alloy.

The surface metal layer 13 is manufactured as follows. A metalizing pattern for the surface metal layer 13 using the metal powder of Mo or the metal powder of Mo and Cu may be formed by printing a metal paste in a predetermined shape using a screen printing method or the like to cover the metal sheet or the metal paste for the heat dissipation member 12 embedded in the ceramic green sheet for the insulating base 11. Similarly, a metalizing pattern for the second surface metal layer 14 is printed at a predetermined position of the ceramic green sheet for the insulating base 11 in a predetermined shape by a screen printing method or the like. The metalizing pattern for the second surface metal layer 14 is disposed on the upper surface or the lower surface around a region where the surface metal layer 13 is disposed. Then, the metalizing patterns are co-fired with the ceramic green sheet for the insulating base 11. The metalizing patterns for the surface metal layer 13 and the second surface metal layer 14 may be manufactured by the same method as in the metal paste for the heat dissipation member 12.

The metalizing pattern that will form the surface metal layer 13 is in contact with the metallic material (metal sheet or metal paste) for the heat dissipation member 12. The metal paste for the surface metal layer 13 contains metal powder of Mo or metal powder of Mo and Cu as a main component, and for example, contains an organic binder or an organic solvent at a rate higher than that of the metal paste for the heat dissipation member 12. By using the metal paste for the surface metal layer 13, when the surface metal layer 13 and the heat dissipation member 12 are fired, the metalizing pattern that will form the surface metal layer 13 is in a state of a porosity higher than that of the metalizing pattern that will form the heat dissipation member 12. Thus, for example, when the ceramic green sheet for the insulating base 11 of the aluminum oxide-based sintered compact is fired, by performing the firing at a temperature (about 1300° C. to about 1400° C.) higher than the melting point of Cu, Cu contained in the metal sheet or the metal paste that will form the heat dissipation member 12 containing Cu and W is dissolved to pass between metal particles of Mo in the surface metal layer 13, and is dispersed in the surface of the surface metal layer 13. Thus, the surface of the surface metal layer 13 can be formed of Mo, and can contain Cu. That is, the surface metal layer 13 forms a metalized layer having the surface that contains Mo as the main component and contains Cu.

Figure 1:
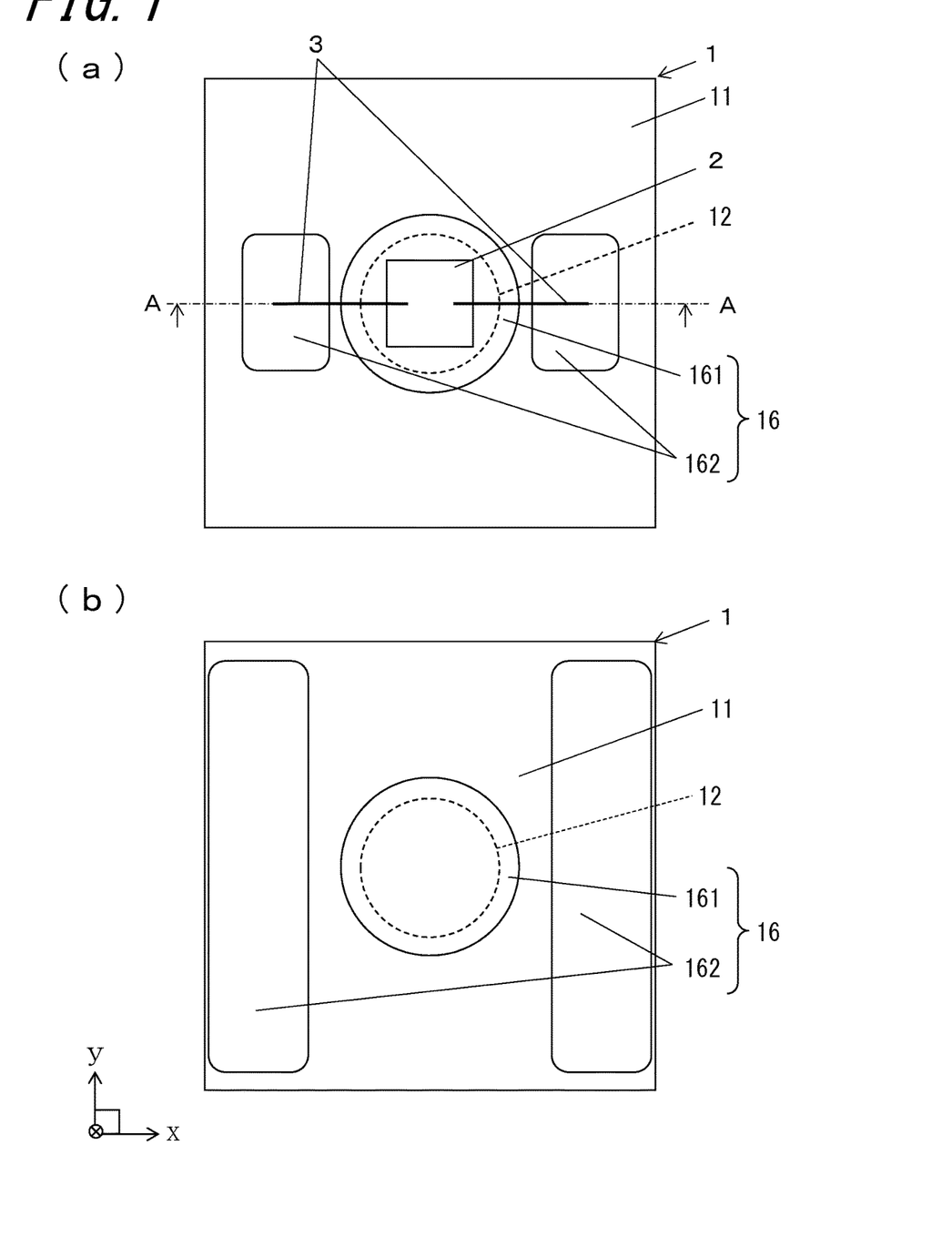
FIG. 1(a) is a top view illustrating an electronic device according to a first embodiment of the invention.
FIG. 1(b) is a bottom view of the electronic device shown in FIG. 1(a)
Figure 2:
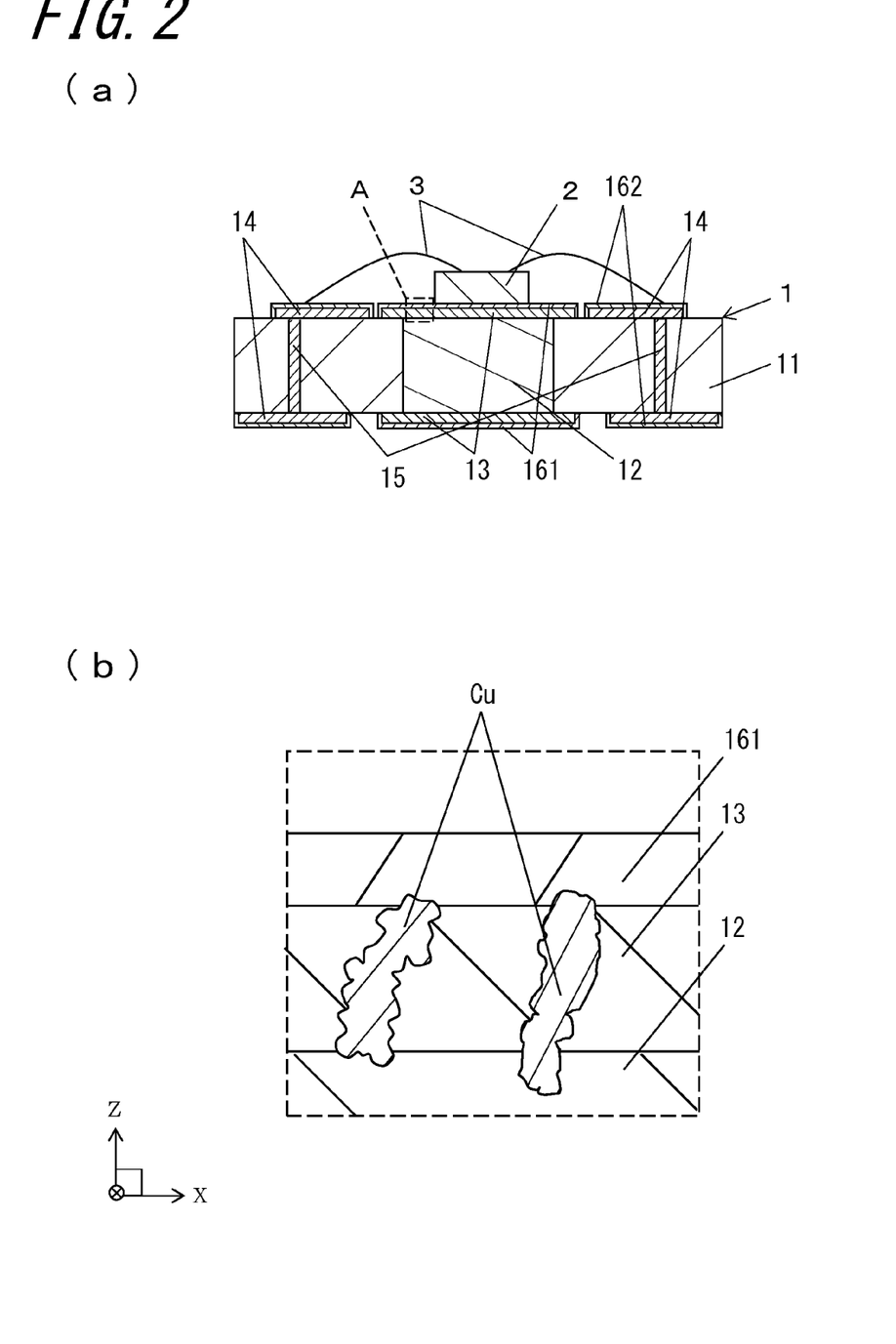
FIG. 2(a) is a cross-sectional view of the electronic device shown in FIG. 1(a) taken along the line A-A.
FIG. 2(b) is an enlarged cross-sectional view of a part A in FIG. 2(a)

Further, as in the examples shown in FIGS. 1 to 3, when the heat dissipation member 12 passes through the insulating base 11, the surface metal layer 13 is disposed to cover a portion of the heat dissipation member 12 exposed on the surface of the insulating base 11 and a portion of the heat dissipation member 12 exposed on the lower surface of the insulating base 11, respectively. In this case, it is possible to dissipate the heat of the electronic component 2 from the upper surface side of the wiring substrate 1 to the lower surface side thereof.

Further, as in the example shown in FIGS. 4 and 5, when the heat dissipation member 12 is exposed only on the upper surface of the insulating base 11, the surface metal layer 13 is disposed to cover a portion of the heat dissipation member 12 exposed on the surface of the insulating base 11. In this case, since the second surface metal layer 14 is disposed in a wide region on the lower surface of the wiring substrate 1, it is possible to improve the bonding strength with respect to the external circuit board. As in the example shown in FIG. 4, when the second surface metal layer 14 is disposed to overlap the heat dissipation member 12 in a plan view, it is possible to improve the heat dissipation characteristic of the wiring substrate 1.

Ceramic powder may be added to the metal paste for the surface metal layer 13 and the second surface metal layer 14, similarly to the metal paste for the heat dissipation member 12. For example, when the insulating base 11 is formed of the aluminum oxide-based sintered compact, it is preferable that the aluminum oxide-based sintered compact is contained in the surface metal layer 13 and the second surface metal layer 14.

Further, as in the example shown in FIG. 3, the plating layer 16 made of nickel, gold or the like is plated onto the exposed surfaces of the surface metal layer 13 and the second surface metal layer 14 by an electroless plating method. The plating layer 16 includes a first plating layer 161 plated on the exposed surface of the surface metal layer 13, and a second plating layer 162 plated on the exposed surface of the second surface metal layer 14. The plating layer 16 may be plated using Cu exposed on the surface of the surface metal layer 13 or the second surface metal layer 14 as a start point.

That is, using Cu that is present to be dotted on the surface portion as a start point on the surface of the surface metal layer 13 containing Mo as the main component, and using Cu of the second surface metal layer 14 as a start point on the surface of the second surface metal layer 14 containing CuW as the main component, the plating layer 16 is plated onto the surface metal layer 13 and the second surface metal layer 14 at a sufficient thickness.

When the plating layer 16 having excellent corrosion resistance, made of nickel, gold or the like, is plated on the exposed surfaces of the surface metal layer 13 and the second surface metal layer 14 as described above, it is possible to reduce corrosion of the surface metal layer 13 and the second surface metal layer 14. Further, it is possible to strongly bond the electronic component 2 onto the surface metal layer 13, and to strongly bond the bonding wire or the external circuit board onto the second surface metal layer 14. On the exposed surfaces of the surface metal layer 13 and the second surface metal layer 14, for example, a nickel plating layer of a thickness of about 1 μm to about 10 μm and a gold plating layer of a thickness of about 0.1 μm to about 3 μm may be sequentially plated.

The wiring conductor 15 is disposed inside the insulating base 11, and electrically connects the electronic component 2 mounted on the wiring substrate 1 to the external circuit board.

The wiring conductor 15 is formed of the same metallic material as that of the heat dissipation member 12, for example. The wiring conductor 15 includes a wiring conductor disposed between insulating layers of the insulating base 11, and a through conductor that passes through the insulating layer and electrically connects the wiring conductors that are disposed up and down or the second surface metal layer 14 and the wiring conductor.

The wiring conductor disposed between the insulating layers is formed by printing and coating a metalizing paste for the wiring conductor 15 in the ceramic green sheet for the insulating base 11 by printing means such as a screen printing method, and firing the metalizing paste together with the ceramic green sheet for the insulating base 11. Further, the through conductor is manufactured as follows. At first, a through hole for the through conductor is formed in the ceramic green sheet for the insulating base 11 by a working method such as a punching work using a die or a punch, or a laser work. In the next step, the metalizing paste for the through conductor is filled in the through hole by the printing means. In the next step, the metalizing paste is fired together with the ceramic green sheet for the insulating base 11.

The metalizing paste for the wiring conductor 15 may be manufactured by the same method as that of the metal paste for the heat dissipation member 12. The metalizing paste for the through conductor is adjusted to have a viscosity higher than that of a metalizing paste for the wiring conductor arranged between the insulating layers to be suitable for the filling by changing the type or amount of an organic binder or an organic solvent to be added.

The electronic component 2 is bonded and mounted on the upper surface of the wiring substrate 1 to overlap the heat dissipation member 12 in a plan view. The electronic component 2 is a light emitting element, for example, and is bonded on the surface metal layer 13 on the upper surface of the wiring substrate 1 by a brazing material formed of a gold-silicon (Au—Si) alloy or a conductive bonding material such as an epoxy resin containing silver (Ag). Further, an electrode of the electronic component 2 and the second surface metal layer 14 are electrically connected to each other through a connection member 3 such as a bonding wire containing Au as a main component, for example.

When the light emitting element is mounted as the electronic component 2, as in the example shown in FIGS. 4 and 5, the insulating base 11 may have a cavity 4, and may be provided with a reflecting layer 5 for reflecting light emitted from the light emitting element toward an inner wall of the cavity 4. The reflecting layer 5 is formed by sequentially plating a metalized layer and the plating layer 16 or plating a resin film or a metal film onto the inner wall of the cavity 4, for example. On the exposed surface of the reflecting layer 5, metal such as nickel, gold or silver is plated.

The wiring substrate 1 of the present embodiment includes the insulating base 11; the heat dissipation member 12 disposed in the insulating base 11 to be partially exposed from the insulating base 11, the heat dissipation member 12 containing Cu; the surface metal layer 13 disposed on the surface of the insulating base 11 so as to contact and cover the heat dissipation member 12, the surface metal layer 13 containing Mo as the main component and including the surface portion containing Cu; and the plating layer 16 disposed on the surface metal layer 13. Cu contained in the heat dissipation member 12 and Cu contained in the surface portion of the surface metal layer 13 are bonded to each other. With such a structure, the plating layer 16 is plated onto the surface metal layer 13 using the Cu contained in the surface portion of the surface metal layer 13 as the start point. Further, since Cu contained in the heat dissipation member 12 and Cu contained in the surface portion are bonded to each other, it is possible to suppress Cu bonded to the plating layer 16 from being peeled off from the surface portion together with the plating layer 16. Accordingly, it is possible to suppress the plating layer 16 from being peeled off from the surface metal layer 13. Further, since Cu contained in the surface portion of the surface metal layer 13 is bonded to Cu of the heat dissipation member 12, it is possible to improve the thermal conductivity of the heat generated at the electronic component 2 to the heat dissipation member 12.

Further, since the electronic device of the present embodiment includes the wiring substrate 1 having the above-described configuration and the electronic component 2 mounted on the wiring substrate 1, it is possible to increase the thermal conductivity from the electronic device to the external circuit board, and to improve the heat dissipation characteristic of the electronic device.

(Second Embodiment)

Figure 6:
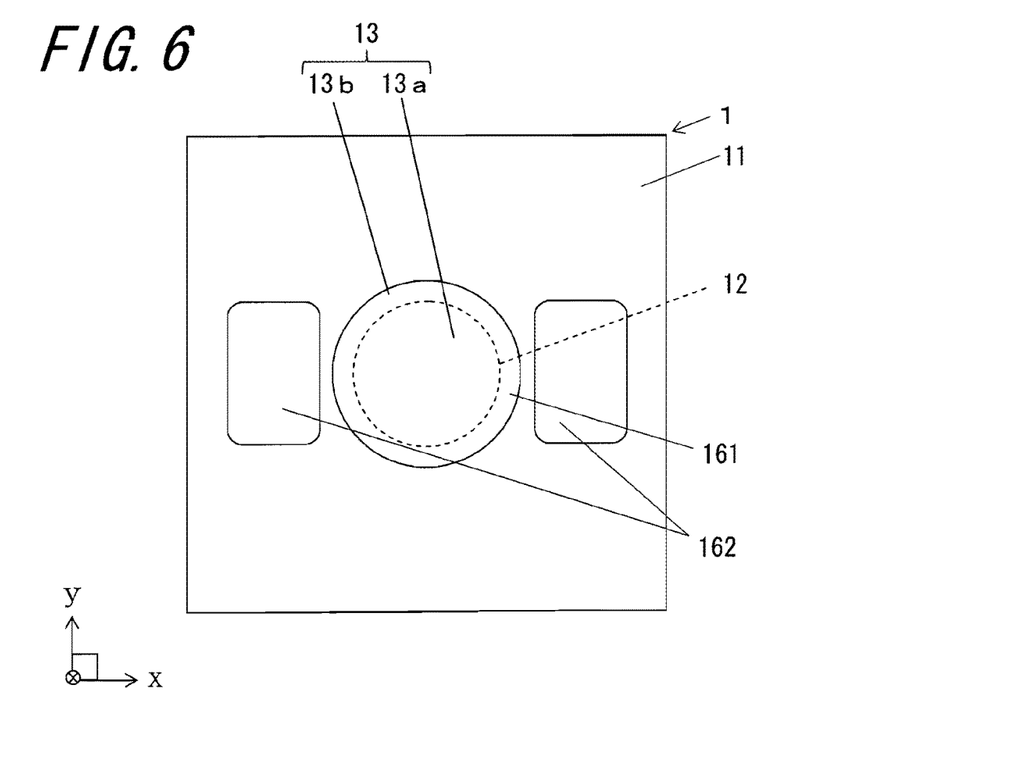
FIG. 6 is a top view illustrating an electronic device according to a second embodiment of the invention.

Next, an electronic device according to a second embodiment of the invention will be described with reference to FIG. 6.

The electronic device according to the second embodiment of the invention is different from the electronic device according to the first embodiment in that in a surface of the surface metal layer 13, a content rate (i.e. ratio) of Cu in a first region 13a, which overlaps the heat dissipation member in a plan view, of the surface metal layer 13 is larger than a content rate (i.e. ratio) of Cu in a second region 13b of a vicinity of the first region.

Since, in the surface of the surface metal layer 13, the content rate of Cu in the first region 13a is larger than the content rate of Cu in the second region 13b, the thickness of the plating layer 16 on the surface of the second region 13b becomes thin compared with the surface of the first region 13a. Thus, when the electronic component 2 is bonded to the surface metal layer 13 by a brazing material, the thickness of the brazing material in the second region 13b becomes thin. In the second region 13b that includes an outer edge that easily serves as a start point of peeling of the surface metal layer 13, it is possible to reduce stress applied to the surface metal layer 13 from the brazing material, and thus, it is possible to suppress the surface metal layer 13 from being peeled off from the insulating base 11.

As a method of measuring the content rates of Cu of the surface of the first region 13a and the surface of the second region 13b, for example, a method of measuring a distribution state of Cu on the surface of the surface metal layer 13 by Auger electron spectroscopy may be used.

(Third Embodiment)

Next, an electronic device according to a third embodiment of the invention will be described.

The electronic device according to the third embodiment of the invention is different from the electronic device according to the first embodiment in that, in an inside portion of the surface metal layer 13, a content rate of Cu in the first region 13a, which overlaps the heat dissipation member 12 in a plan view, of the surface metal layer 13 is larger than a content rate of Cu in the second region 13b of the inside portion of a vicinity of the first region 13a.

Since, in the inside portion of the surface metal layer 13, the content rate of Cu in the first region 13a is larger than the content rate of Cu in the second region 13b, the thermal conductivity of the first region 13a is higher than the thermal conductivity of the second region 13b. Thus, it is possible to improve the heat dissipation characteristic in the first region 13a where temperature easily increases compared with the vicinity thereof due to the heat generated at the electronic component 2. Accordingly, it is possible to reduce the temperature difference between the first region 13a and the second region 13b, and thus, it is possible to reduce thermal stress generated in the surface metal layer 13 due to different temperatures of the first region 13a and the second region 13b. Further, by enhancing the heat dissipation characteristic in the central portion, it is possible to reduce the amount of heat transferred to the periphery of the surface metal layer.

As a method of measuring the content rates of Cu in the first region 13a and the second region 13b, for example, a method of repeating a measurement process using Auger electron spectroscopy after polishing the surface metal layer 13a for measurement of the inside thereof, or a method of measuring a distribution state of Cu inside the surface metal layer 13 by a secondary ion mass analysis method may be used.

The invention is not limited to the above-described embodiments, and may include various modifications. For example, a castellation conductor in which a groove is disposed in a side surface of the insulating base 11 and the second surface metal layer 14 is disposed in the groove may be used.

Further, the second surface metal layer 14 bonded to the external circuit board may be disposed on the upper surface side of the insulating base 11.

Further, a metal body with an excellent heat dissipation characteristic, made of CuW, aluminum (Al) or the like, may be bonded on the lower surface of the wiring substrate 1, for example. In this case, the metal body may be formed using the similar material as that of the heat dissipation member 12. It is preferable that the material of the metal body is CuW so as to have a thermal expansion amount close to that of the heat dissipation member 12.

Figure 7:
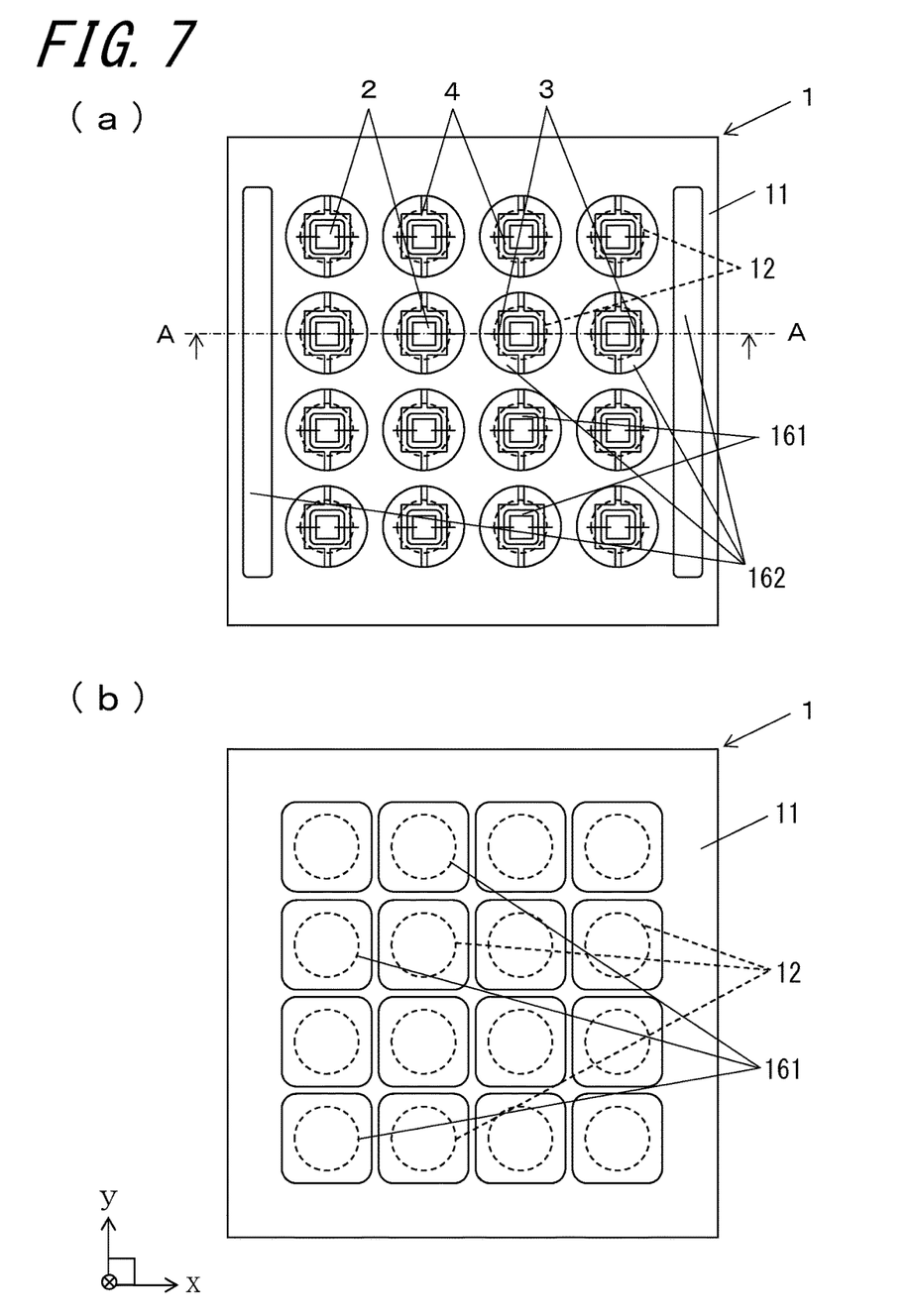
FIG. 7(a) is a top view illustrating another example of the electronic device according to the first embodiment of the invention.
FIG. 7(b) is a bottom view of the electronic device shown in FIG. 7(a)
Figure 8:
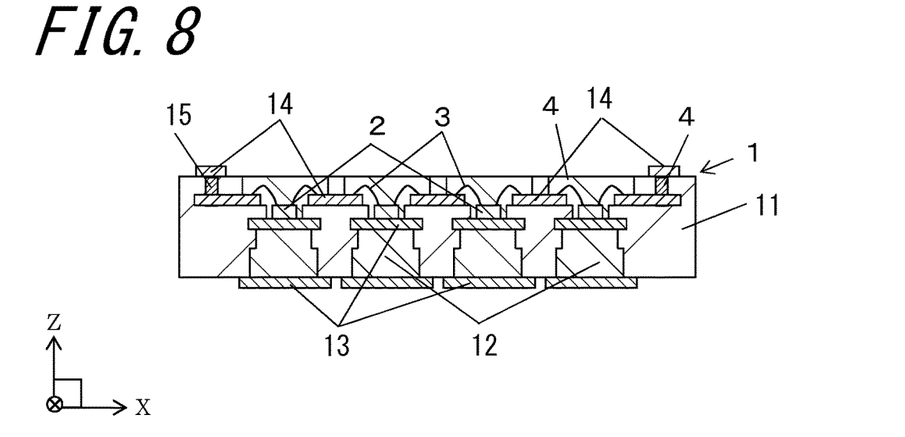
FIG. 8 is a cross-sectional view of the electronic device shown in FIG. 7(a) taken along the line A-A.

Further, as in an example shown in FIGS. 7 and 8, the plural electronic components 2 may be mounted on the wiring substrate 1. In FIG. 8, the plating layer 16 is not shown. In this case, the plural electronic components 2 may be mounted on one surface metal layer 13, or alternatively, the plural surface metal layers 13 may be disposed on the insulating base 11 and one electronic component 2 may be mounted on each surface metal layer 13. In the case where the plural surface metal layers 13 are provided, when each of the plural surface metal layers 13 contacts the heat dissipation member 12, it is possible to improve the heat dissipation characteristic of the electronic component 2.

REFERENCE SIGNS LIST

1: Wiring substrate
11: Insulating base
12: Heat dissipation member
13: Surface metal layer
13a: First region
13b: Second region
14: Second surface metal layer
15: Wiring conductor
16: Plating layer
161: First plating layer
162: Second plating layer
2: Electronic component
3: Connection member
4: Cavity
5: Reflecting layer
Cu: Copper

What is claimed is:

1. A wiring substrate, comprising: an insulating base; a heat dissipation member disposed in the insulating base, the heat dissipation member partially exposed from the insulating base, the heat dissipation member containing Cu; a surface metal layer disposed on a surface of the insulating base, the surface metal layer contacting and covering the heat dissipation member, the surface metal layer containing Mo as a main component, the surface metal layer comprising a surface portion, the surface portion containing Cu; and a plating layer disposed on the surface metal layer, wherein the surface portion protrudes from a surface of the surface metal layer on a side of the heat dissipation member, and Cu contained in the heat dissipation member and Cu contained in the surface portion are bonded to each other, in a plan view, the surface of the surface metal layer comprises: a first region overlapping the heat dissipation member: and a second region surrounding the first region, and each of the first region and the second region contains Cu, and a content ratio of Cu in the first region is larger than a content rate of Cu in the second region.

2. The wiring substrate according to claim 1,
wherein the surface metal layer comprises an inside portion,
the inside portion comprising:
a third region overlapping the heat dissipation member in the plan view, the third region containing Cu; and
a fourth region located in a vicinity of the third region in the plan view, the fourth region containing Cu, and
wherein a content rate of Cu in the third region is larger than a content rate of Cu in the fourth region.

3. An electronic device, comprising:
the wiring substrate according to claim 1; and
an electronic component mounted on the wiring substrate.

* * * * *